(12) United States Patent
Nakagomi et al.

(10) Patent No.: US 12,387,955 B2
(45) Date of Patent: Aug. 12, 2025

(54) SUBSTRATE PROCESSING APPARATUS AND SUBSTRATE PROCESSING METHOD

(71) Applicant: Tokyo Electron Limited, Tokyo (JP)

(72) Inventors: Wataru Nakagomi, Nirasaki (JP); Tatsuya Mukoyama, Nirasaki (JP); Kazunori Kazama, Nirasaki (JP); Shigeru Kubota, Nirasaki (JP); Sho Ichinose, Nirasaki (JP); Junya Chizuwa, Nirasaki (JP); Akihito Komiyama, Nirasaki (JP); Ryuhei Higashimura, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 383 days.

(21) Appl. No.: 17/257,637

(22) PCT Filed: Jun. 25, 2019

(86) PCT No.: PCT/JP2019/025160
§ 371 (c)(1),
(2) Date: Jan. 4, 2021

(87) PCT Pub. No.: WO2020/008955
PCT Pub. Date: Jan. 9, 2020

(65) Prior Publication Data
US 2021/0280445 A1 Sep. 9, 2021

(30) Foreign Application Priority Data
Jul. 5, 2018 (JP) .................................. 2018-128186

(51) Int. Cl.
*H01L 21/67* (2006.01)
*G05B 19/418* (2006.01)
(Continued)

(52) U.S. Cl.
CPC .. *H01L 21/67276* (2013.01); *G05B 19/41875* (2013.01); *H01L 21/02057* (2013.01);
(Continued)

(58) Field of Classification Search
CPC ......... H01L 21/67276; H01L 21/67207; H01L 21/67173; H01L 21/67098;
(Continued)

(56) References Cited

U.S. PATENT DOCUMENTS

| 6,775,817 B2 * | 8/2004 | Ono .................... G01N 21/956 716/55 |
| 2002/0113234 A1 * | 8/2002 | Okuda ............... G01N 21/9501 257/48 |

(Continued)

FOREIGN PATENT DOCUMENTS

| JP | 11-214276 A | 8/1999 |
| JP | 2003-273003 A | 9/2003 |

(Continued)

*Primary Examiner* — Mary A Wilczewski
(74) *Attorney, Agent, or Firm* — Nath, Goldberg & Meyer; Jerald L. Meyer; Tanya E. Harkins

(57) ABSTRACT

A substrate processing apparatus is provided. The substrate processing apparatus for processing substrates includes a plurality of processing modules that perform predetermined processes on the substrates, and an information display that displays information about an error that occurred in the predetermined processes. The information display displays, in the same screen, a substrate on which a predetermined process in which the error occurred, a processing module which was performing the predetermined process in which the error occurred, the timing at which the error occurred, and a main cause of the error.

10 Claims, 6 Drawing Sheets

(51) Int. Cl.
    *H01L 21/02*         (2006.01)
    *H01L 21/324*       (2006.01)
    *H01L 21/66*         (2006.01)

(52) U.S. Cl.
    CPC ...... *H01L 21/324* (2013.01); *H01L 21/67207* (2013.01); *H01L 22/20* (2013.01); *G05B 2219/37224* (2013.01)

(58) Field of Classification Search
    CPC ............. H01L 21/02057; H01L 21/324; H01L 21/31116; H01L 22/20; H01L 21/67253; G05B 19/41875; G05B 2219/37224; G05B 2219/45031; Y02P 90/02; H04N 1/00408
    See application file for complete search history.

(56) References Cited

U.S. PATENT DOCUMENTS

| | | | | |
|---|---|---|---|---|
| 2002/0181756 | A1* | 12/2002 | Shibuya | G01N 21/956 356/237.4 |
| 2003/0216053 | A1* | 11/2003 | Miyata | H01L 21/6715 438/758 |
| 2004/0064269 | A1* | 4/2004 | Shibuya | G06T 7/0004 702/40 |
| 2004/0218806 | A1* | 11/2004 | Miyamoto | G06F 18/40 382/145 |
| 2006/0012782 | A1* | 1/2006 | Lim | G01N 21/95607 356/237.5 |
| 2006/0078188 | A1* | 4/2006 | Kurihara | G06T 7/0004 382/149 |
| 2008/0075352 | A1* | 3/2008 | Shibuya | G01N 21/9501 382/141 |
| 2008/0317329 | A1* | 12/2008 | Shibuya | G06T 7/0004 382/149 |
| 2013/0202189 | A1* | 8/2013 | Shibuya | G06V 10/7788 382/149 |
| 2016/0027672 | A1* | 1/2016 | Asakawa | H01L 21/68785 156/345.37 |
| 2021/0280445 | A1* | 9/2021 | Nakagomi | H01L 21/02057 |
| 2023/0083863 | A1* | 3/2023 | Yamamoto | H01L 21/67184 700/109 |

FOREIGN PATENT DOCUMENTS

| | | | | |
|---|---|---|---|---|
| JP | 2008-311461 A | | 12/2008 | |
| JP | 2010-62367 A | | 3/2010 | |
| JP | 6860365 | * | 3/2021 | ....... H01L 21/67742 |
| KR | 1020060105518 A | | 10/2006 | |
| KR | 1020090043511 A | | 5/2009 | |
| WO | WO 2011/036846 | * | 3/2011 | ....... G01N 21/95607 |
| WO | WO 2020008955 | * | 1/2020 | ........... H01L 21/324 |

* cited by examiner

FIG. 6

| Wafer ID | Cycle No. | Wafer position | Error occurrence timing | Cause of error |
|---|---|---|---|---|
| 1-1 | 5/5 | ----- | --:--:-- | ------------ |
| 1-2 | 5/5 | ----- | --:--:-- | ------------ |
| 1-3 | 3/5 | COR41 | h:mm:ss | XXXXXXXXXXXXXXX |
| 1-4 | 5/5 | ----- | --:--:-- | ------------ |
| ⋮ | ⋮ | ⋮ | ⋮ | ⋮ |

SUBSTRATE PROCESSING APPARATUS AND SUBSTRATE PROCESSING METHOD

CROSS-REFERENCE OF RELATED APPLICATION

This is a National Phase Application filed under 35 U.S.C. 371 as a national stage of PCT/JP2019/025160, filed Jun. 25, 2019, an application claiming the benefit of Japanese Patent Application No. 2018-128186, filed in Japan on Jul. 5, 2018, the disclosure of each of which is incorporated herein in its entirety by reference.

TECHNICAL FIELD

The present disclosure relates to a substrate processing apparatus and a substrate processing method.

BACKGROUND

Patent Document 1 discloses an exposure apparatus having a display device, which displays information related to errors that occurred during a process related to exposure. The display device includes an information display that displays thereon various processing information related to an exposure process and a process related to exposure, a mode-setting part that is configured to perform switching between various modes via a touch panel, and a numerical value input part through which various numerical values are input.

RELATED ART DOCUMENTS

Patent Documents

Patent Document 1: Japanese Patent Publication No. 2010-62367

SUMMARY

According to one embodiment of the present disclosure, there is provided a substrate processing apparatus for processing substrates, the substrate processing apparatus comprising a plurality of processing modules configured to perform predetermined processes on the substrates, and an information display configured to display information about an error that occurred in the predetermined processes, wherein the information display is configured to display, in a same screen, a substrate on which a predetermined process in which the error occurred was being performed, a processing module which was performing the predetermined process in which the error occurred, a timing at which the error occurred, and a cause of the error.

According to the present disclosure, it is possible to easily determine error information on substrate processing, which is displayed on an information display.

BRIEF DESCRIPTION OF DRAWINGS

FIG. 6 is an exemplary error display screen according to an embodiment.

DETAILED DESCRIPTION

Figure 1:
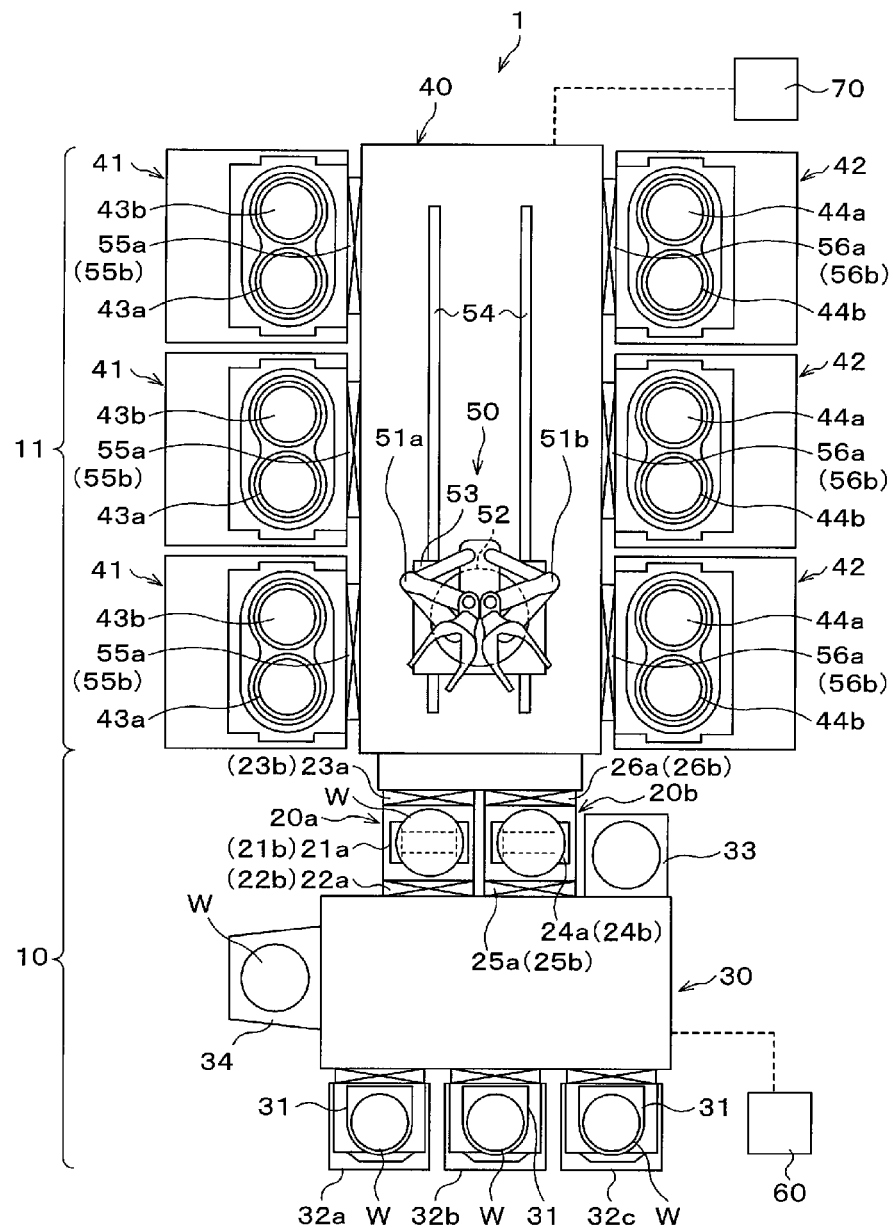
FIG. 1 is a plan view schematically illustrating a configuration of a substrate processing apparatus according to an embodiment.

In a process for manufacturing a semiconductor device, in a state in which a processing module containing a semiconductor wafer (hereinafter, also referred to as a "wafer") is decompressed, various processes are performed so as to perform a predetermined process on the wafer. These multiple processes are performed using, for example, a substrate processing apparatus in which a plurality of processing modules are arranged around a common transport module.

The above-mentioned predetermined process performed in the substrate processing apparatus includes, for example, a Chemical Oxide Removal (COR) process and a Post Heat Treatment (PHT) process. The COR process is a process that causes an oxide film formed on a wafer and a processing gas to react with each other. The PHT process is a heating process that heats and vaporizes a product produced in the COR process. By sequentially performing the COR process and the PHT process, an oxide film formed on the wafer is etched. In addition, the COR process and the PHT process may be repeated multiple times on the same wafer in order to achieve a desired etching thickness on the wafer.

For example, the exposure apparatus disclosed in Patent Document 1 has an information display configured to display error information. Similarly, even when a certain error occurred in the above-mentioned COR process and PHT process, information on the error is displayed on the information display provided in the substrate processing apparatus.

However, conventionally, there has been a case where information for determining an error state, for example an erroneous substrate in a PJ to be described later, a processing module in which an error occurred, a timing at which an error occurred, and an error factor, are separately displayed on a plurality of screens in the information display. In particular, in the conventional information display, since it is necessary to refer to separate screens in order to determine the state of a substrate or a processing module in which the error occurred, it takes a lot of time and effort to refer to this information.

When a process cycle for sequentially performing the COR process and the PHT process described above is repeated multiple times on the same wafer, the error information displayed on the information display is further increased. For example, it is necessary to display information on the cycle number at which the error occurred on the information display, that is, how many times the process cycle was performed until the error occurred. However, in the conventional information display, it is necessary to refer to a plurality of different screens in order to determine this cycle number, which further increases the required time and effort.

The technique according to the present disclosure makes it easy to determine error information on wafer processing as substrate processing, which is displayed on an information display. Specifically, the process results of all the wafers in a PJ to be described later are listed and displayed in one screen. As a result, when an operator considers a method for recovering a substrate on which an error occurred, it is possible for the operator to obtain necessary information immediately by referring to only the one screen.

Hereinafter, a configuration of a substrate processing apparatus according to the present embodiment will be described with reference to the drawings. In this disclosure, elements having substantially the same functional configurations will be denoted by the same reference numerals, and redundant descriptions will be omitted.

<Substrate Processing Apparatus>

FIG. 1 is a plan view schematically illustrating the configuration of a substrate processing apparatus according to the present embodiment. In the present embodiment, the case where a substrate processing apparatus 1 includes various processing modules for performing a COR process, a PHT process, and a Cooling Storage (CST) process on a wafer W as a substrate will be described. That is, the processing module in the present embodiment refers to a COR module, a PHT module, or a CST module. However, the module configuration of the substrate processing apparatus of the present disclosure is not limited thereto, and can be arbitrarily selected.

As illustrated in FIG. 1, the substrate processing apparatus 1 includes a configuration in which an atmospheric part 10 and a decompressed part 11 are integrally connected via load-lock modules 20a and 20b as transport modules. The atmospheric part 10 includes a plurality of atmospheric modules configured to perform respective predetermined processes on wafers W under an ambient atmosphere. The decompressed part 11 includes a plurality of decompressed modules configured to perform respective predetermined processes on wafers W under a decompressed atmosphere.

The load-lock module 20a temporarily holds a wafer W which is transported from a to-be-described loader module 30 in the atmospheric part 10, in order to deliver the wafer W to a to-be-described transfer module 40 in the decompressed part 11. The load-lock module 20a has an upper stocker 21a and a lower stocker 21b configured to hold two wafers W such that the wafers W overlap each other.

In addition, the load-lock module 20a is connected to the to-be-described loader module 30 through a gate 22b provided with a gate valve 22a. With the gate valve 22a, both security of airtightness and communication between the load-lock module 20a and the loader module 30 are achieved in a compatible manner. The load-lock module 20a is connected to the to-be-described transfer module 40 through a gate 23b provided with a gate valve 23a. With the gate valve 23a, both security of airtightness and communication between the load-lock module 20a and the transfer module 40 are achieved in a compatible manner.

A gas supply part (not illustrated) configured to supply gas and an exhaust part (not illustrated) configured to discharge gas are connected to the load-lock module 20a, and the inside of the load-lock module 20a is configured to be switchable between an ambient atmosphere and a decompressed atmosphere by the gas supply part and the exhaust part. That is, the load-lock module 20a is configured to appropriately deliver a wafer W between the atmospheric part 10 having the ambient atmosphere and the decompressed part 11 having the decompressed atmosphere.

The load-lock module 20b has the same configuration as the load-lock module 20a. That is, the load-lock module 20b has an upper stocker 24a, a lower stocker 24b, a gate valve 25a and a gate 25b on the loader module 30 side, and a gate valve 26a and a gate 26b on the transfer module 40 side.

The atmospheric part 10 includes a loader module 30 as a transport module including a wafer transport mechanism (not illustrated), a load port 32 in which a hoop 31 capable of storing a plurality of wafers W is placed, and a CST module 33 configured to cool a wafer W, and an orienter module 34 configured to adjust the horizontal orientation of a wafer W.

The loader module 30 has an inside formed as a rectangular housing, and the inside of the housing is maintained in an ambient atmosphere. A plurality of (e.g., three) load ports 32a to 32c are arranged side by side on one side surface forming a long side of the housing of the loader module 30. The load-lock modules 20a and 20b and the CST module 33 are arranged side by side on the other side surface forming another long side of the housing of the loader module 30. An orienter module 34 is arranged on one side surface forming a short side of the housing of the loader module 30. The arrangement and number of CST modules 33 and orienter modules 34 are not limited to the present embodiment, and can be arbitrarily designed. In addition, the loader module 30 has a wafer transport mechanism (not illustrated), which is movable in the longitudinal direction inside the housing. The wafer transport mechanism is able to transport wafers W among the hoop 31 mounted in each load port 32, the load-lock modules 20a and 20b, the CST module 33, and the orienter module 34. In addition, the configuration of the wafer transport mechanism is the same as the configuration of the wafer transport mechanism 50, which will be described later.

The hoop 31 accommodates a plurality of wafers W overlapped at equal intervals in multiple stages. In addition, the inside of the hoop 31 placed in the load port 32 is filled with, for example, air or nitrogen gas, and is sealed.

The CST module 33 is arranged adjacent to the load-lock module 20b, and is connected to the loader module 30. The CST module 33 is able to accommodate a plurality of wafers W overlapped at equal intervals in multiple stages, and cools the plurality of wafers W. Specifically, the CST module 33 cools the wafers W heated in a PHT module 42, which will be described later.

The orienter module 34 rotates a wafer W so as to adjust the orientation of the wafer W in the horizontal direction. Specifically, when a process cycle to be described later is repeatedly performed, the orienter module 34 adjusts the orientation of a wafer W from a reference position (e.g., a notch position) in the horizontal direction for each process cycle.

The decompressed part 11 includes a transfer module 40 as a transport module configured to simultaneously transport two wafers W, a COR module 41 configured to perform a COR process on the wafers W transported from the transfer module 40, and a PHT module 42 configured to perform a PHT process on the wafers W. Each of the insides of the transfer module 40, the COR modules 41, and the PHT modules 42 is maintained in a decompressed atmosphere.

In the decompressed part 11, a series of processes (in the present embodiment, a COR process and a PHT process) are sequentially performed on the wafers W. In addition, the transfer module 40 is provided with a plurality of (e.g., three in the present embodiment) COR modules 41 and PHT modules 42 in the longitudinal direction of the transfer module 40.

The transfer module 40 has an inside formed as a rectangular housing, and the wafers W carried into the load-lock module 20a are sequentially transported to one COR module 41 and one PHT module 42, and a COR process and a PHT process are performed thereon. Thereafter, the transfer module 40 carries out the wafers W to the atmospheric part 10 through the load-lock module 20b.

Inside the COR module 41, two stages 43a and 43b are provided on which two wafers W are placed side by side in the horizontal direction. The COR module 41 simultaneously performs the COR process on the two wafers W by arranging and placing the wafers W on the stages 43a and 43b. In addition, the COR module 41 is connected to a gas supply part (not illustrated) configured to supply, for example, a processing gas or a purge gas, and an exhaust part (not illustrated) configured to discharge gas.

Inside the PHT module 42, two stages 44a and 44b are provided on which two wafers W are arranged and placed in the horizontal direction. The PHT module 42 simultaneously performs a PHT process on two wafers W by arranging and placing the wafers W on the stages 44a and 44b. In addition, the PHT module 42 is connected to a gas supply part (not illustrated) configured to supply a gas, and an exhaust part (not illustrated) configured to discharge the gas.

Inside the transfer module 40, a wafer transport mechanism 50 configured to transport wafers W is provided. The wafer transport mechanism 50 includes transport arms 51a and 51b configured to hold and move two wafers W such that the two wafers W overlap each other, a turntable 52 configured to rotatably support the transport arms 51a and 51b, and a rotary placement stage 53 on which the turntable 52 is mounted. In addition, inside the transfer module 40, guide rails 54 are provided to extend in the longitudinal direction of the transfer module 40. The rotary placement stage 53 is provided on the guide rails 54, and the wafer transport mechanism 50 is configured to be movable along the guide rails 54.

The transfer module 40 is connected to the load-lock modules 20a and 20b through the gate valves 23a and 26a as described above. Each COR module 41 is connected to the transfer module 40 through a gate 55b provided with a gate valve 55a. With the gate valve 55a, both security of airtightness and communication between the transfer module 40 and the COR module 41 are achieved in a compatible manner. In addition, each PHT module 42 is connected to the transfer module 40 through a gate 56b provided with a gate valve 56a. With the gate valve 56a, both security of airtightness and communication between the transfer module 40 and the PHT module 42 are achieved in a compatible manner.

In the transfer module 40, the two wafers W held to overlap each other in the upper stocker 21a and the lower stocker 21b of the load-lock module 20a are received such that the two wafers W also overlap each other in the transport arm 51a, and the two wafers W are transported to a COR module 41. The two wafers W which have been COR processed are held to overlap each other by the transport arm 51a, and are transported to a PHT module 42. Further, the two wafers W which have been PHT processed are held to overlap each other by the transport arm 51b, and are carried out to the load-lock module 20b.

The substrate processing apparatus 1 described above is provided with a display panel 60 as an information display. The display panel 60 is, for example, a monitor or a touch panel, and may be directly installed on the substrate processing apparatus 1 or may be remotely checked. The display panel 60 displays, for example, information about an error that occurred in wafer W processing.

The substrate processing apparatus 1 described above is also provided with a controller 70. The controller 70 is, for example, a computer, and has a program storage (not illustrated). In the program storage, a program for controlling wafer W processing in the substrate processing apparatus 1 is stored. In the program storage, a control program for controlling various processes by a processor and a program for causing each component of the substrate processing apparatus 1 to process a wafer W depending on a processing condition, for example, a processing recipe, are also stored. The program may be recorded in a computer-readable storage medium, and may be installed in the controller 70 from the storage medium. The storage medium may be a non-transient storage device.

A control job (hereinafter, also referred to as a "CJ") and a process job (hereinafter, also referred to as a "PJ") are set on wafers in the hoops 31 as information for managing wafer-processing contents. The CJ is a group unit of PJs set for each wafer W, and is set for each hoop 31 in the present embodiment. In a PJ, for example, information that specifies a processing recipe to be executed for each wafer W is set.

The CJ includes an ID as an individual number of each CJ (hereinafter, also referred to as a "CJID") and information that specifies the hoop 31 for which the CJ having the PJID (as defined below) is set. It is possible to set a plurality of PJs for each CJ. Each PJ includes an ID as an individual number of the PJ (hereinafter, also referred to as a "PJID"), information that specifies the wafer W for which the PJ having the PJID is set, and information that specifies a processing recipe to be executed. The wafers W on which respective PJs are executed are specified depending on the positions of the load ports 32a to 32c in which the hoops 31 are placed.

The information about these CJs and PJs is individually set for respective hoops 31 and wafers W accommodated in the respective hoops 31, and the controller 70 selects processing recipes to be executed on the wafers W based on the information set in the CJs and PJs.

<Operation of Substrate Processing Apparatus>

The substrate processing apparatus 1 according to the present embodiment is configured as described above. Next, wafer processing in the substrate processing apparatus 1 will be described.

First, a hoop 31 containing a plurality of wafers W is placed in a load port 32. Thereafter, the loader module 30 takes out two wafers W from the hoop 31, and carries the wafers W into the load-lock module 20a. When the two wafers W are carried into the load-lock module 20a, the gate valve 22a is closed, and the inside of the load-lock module 20a is sealed and decompressed. Thereafter, the gate valve 23a is opened, and the inside of the load-lock module 20a and the inside of the transfer module 40 communicate with each other.

Next, when the load-lock module 20a and the transfer module 40 communicate with each other, the two wafers W are held to overlap each other by the transport arm 51a of the wafer transport mechanism 50, and are carried into the transfer module 40 from the load-lock module 20a. Subsequently, the wafer transport mechanism 50 moves to the front of one COR module 41.

Next, the gate valve 55a is opened, and the transport arm 51a holding the two wafers W enters the COR module 41. Then, one wafer W is placed on each of the stages 43a and 43b from the transport arm 51a. Thereafter, the transport arm 51a exits from the COR module 41.

Next, when the transport arm 51a exits from the COR module 41, the gate valve 55a is closed, and the COR module 41 performs a COR process on the two wafers W.

Next, when the COR process in the COR module 41 is finished, the gate valve 55a is opened, and the transport arm 51a enters the COR module 41. Then, the two wafers W are delivered from the stages 43a and 43b to the transport arm 51a, and are held to overlap each other by the transport arm 51a. Thereafter, the transport arm 51a exits from the COR module 41, and the gate valve 55a is closed.

Next, the wafer transport mechanism 50 moves to the front of the PHT module 42. Next, the gate valve 56a is opened, and the transport arm 51a holding the two wafers W enters the PHT module 42. Then, one wafer W is delivered to each of the stages 44a and 44b from the transport arm 51a. Thereafter, the transport arm 51a exits from the PHT module 42. Subsequently, the gate valve 56a is closed, and a PHT process is performed on the two wafers W.

Next, when the PHT process on the wafers W is finished, the gate valve 56a is opened, and the transport arm 51b enters the PHT module 42. Then, the two wafers W are delivered from the stages 44a and 44b to the transport arm 51b, and are held by the transport arm 51b. Thereafter, the transport arm 51b exits from the PHT module 42, and the gate valve 56a is closed.

Thereafter, the gate valve 26a is opened, and the two wafers W are carried into the load-lock module 20b by the wafer transport mechanism 50. When the two wafers W are carried into the load-lock module 20b, the gate valve 26a is closed, and the inside of the load-lock module 20b is sealed and decompressed. Thereafter, the two wafers W are accommodated in the CST module 33 by the loader module 30, and the CST process is performed.

When the CST process for a predetermined time is finished, the two wafers W transported to the CST module 33 are accommodated in a hoop 31 mounted in a load port 32 by the loader module 30, and are in the standby state until the process on other wafers W accommodated in the hoop 31 is finished.

In this way, a series of "process cycles" each including a COR process, a PHT process, and a CST process are sequentially performed on all the wafers W accommodated in the hoop 31.

Although the series of process cycles for the wafers W are performed as described above, the etching amount of the wafers W in one process cycle is limited. Therefore, it is necessary to repeat the process cycle on one wafer W in order to obtain a desired etching amount.

Therefore, after a series of process cycles are finished and after positioning by a predetermined angle is performed by the orienter module 34, the two wafers W accommodated in the hoop 31 are transported to the COR module 41, in which the process cycle is performed on the two wafers W again.

The number of times the process cycle is repeated is determined based on, for example, information set in a PJ. When a predetermined number of process cycles for the two wafers W are finished, the two wafers W are accommodated in the hoop 31 in the loader module 30 and are in a standby state. Then, when a predetermined number of process cycles for all the wafers W in the hoop 31 are finished and the last wafer W is accommodated in the hoop 31, a series of wafer processing in the substrate processing apparatus 1 is finished.

Exemplary Display Screen when Error Occurs>

Next, a screen displayed on the display panel 60 when an error occurs in the substrate processing apparatus 1 described above will be described. FIGS. 2 to 5 are explanatory views schematically illustrating exemplary display screens displayed on the display panel 60. Although the substrate processing apparatus 1 is an apparatus according to the present embodiment, in the following description, in order to facilitate understanding of technology, the exemplary display screens will be described as being displayed on the display panel 60 of the substrate processing apparatus 1.

First, the exemplary display screens will be described. As illustrated in FIGS. 2 to 5, the display panel 60 includes an information display area 100 for displaying various kinds of information related to wafer processing, and information selection areas 101 and 102 for switching information displayed in the information display area 100.

Figure 2:
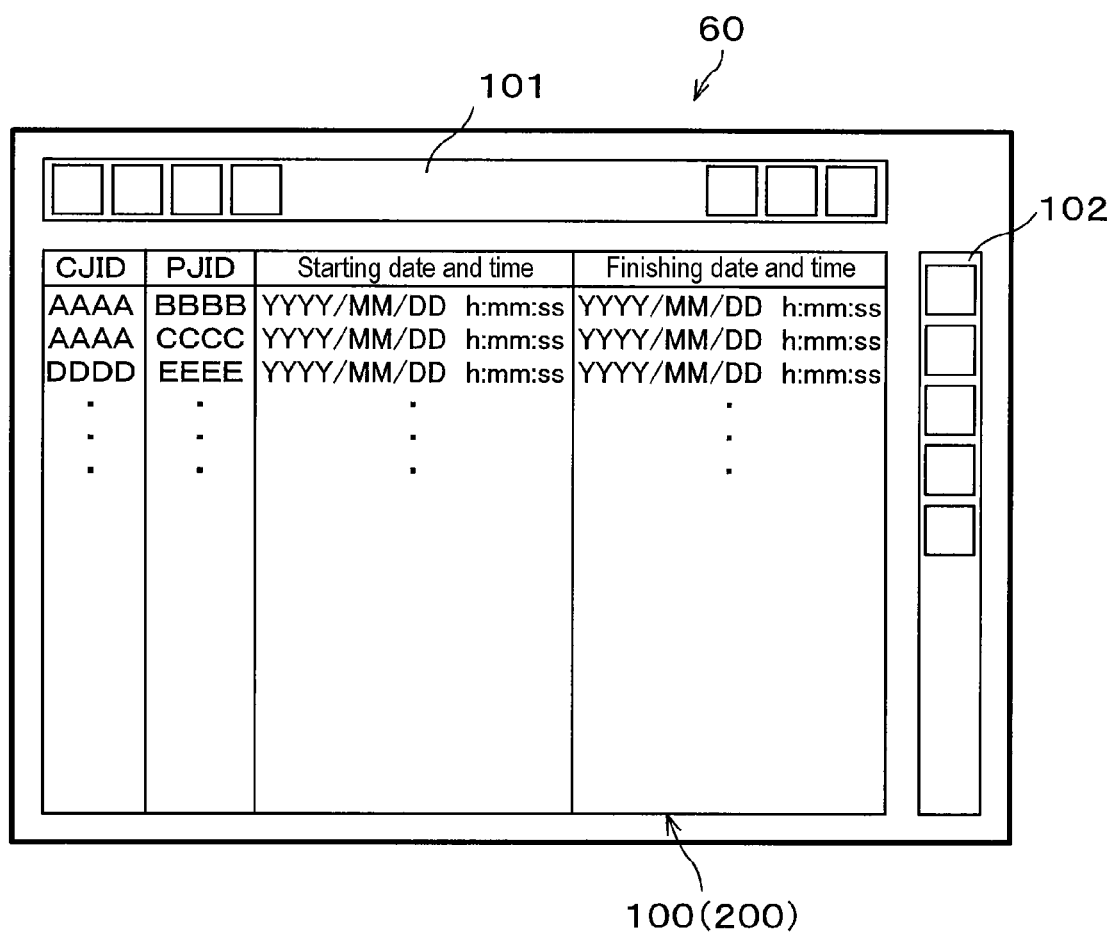
FIG. 2 is an exemplary screen for selecting a Process Job (PJ) log.

As illustrated in FIG. 2, a log list 200 related to wafer W processing is displayed in the information display area 100 in PJ units. The log list 200 displays logs in PJ units for the wafer W processing performed until the operation of the substrate processing apparatus 1 is stopped.

In the log list 200, information related to a plurality of PJs including processed wafers W, for example, CJID, PJID, and the processing timing of each PJ, that is, the starting date and time and the finishing date and time of the processing for each PJ, is displayed. The processing timing of wafers W is displayed in the format of, for example, "YYYY/MM/DD h:mm:ss".

Figure 3:
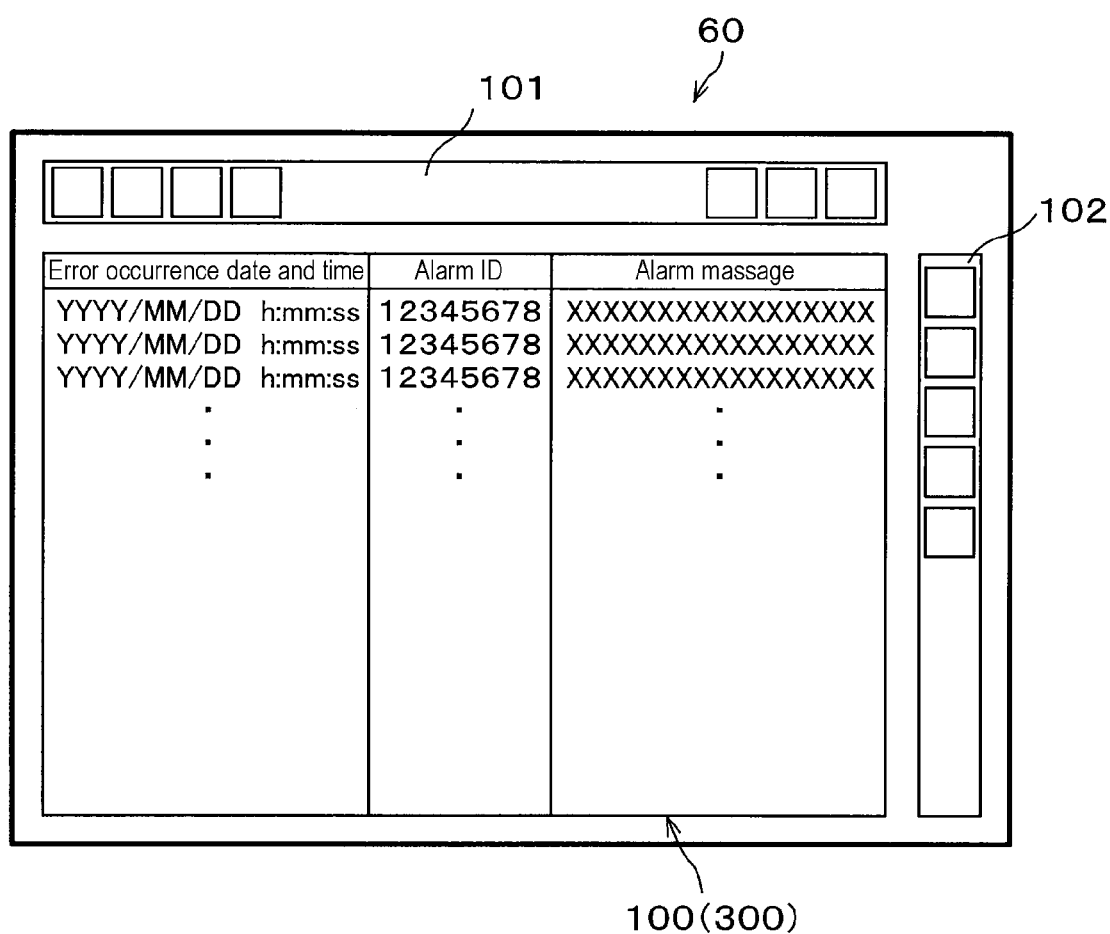
FIG. 3 is an exemplary error display screen.

When the information selection area 101 is selected, an error list 300 illustrated in FIG. 3, in which error information generated in the apparatus is collected, is displayed in the information display area 100.

In the error list 300, for example, error occurrence timing, identification ID of an alarm related to an error, and message related to the alarm are displayed. The error occurrence timing is displayed in the format of, for example, "YYYY/MM/DD h:mm:ss". Further, as the message related to the alarm, the processing module in which the errors occurred and the cause of the error (e.g., non-attainment of the pressure or temperature of the processing module) are displayed.

Figure 4:
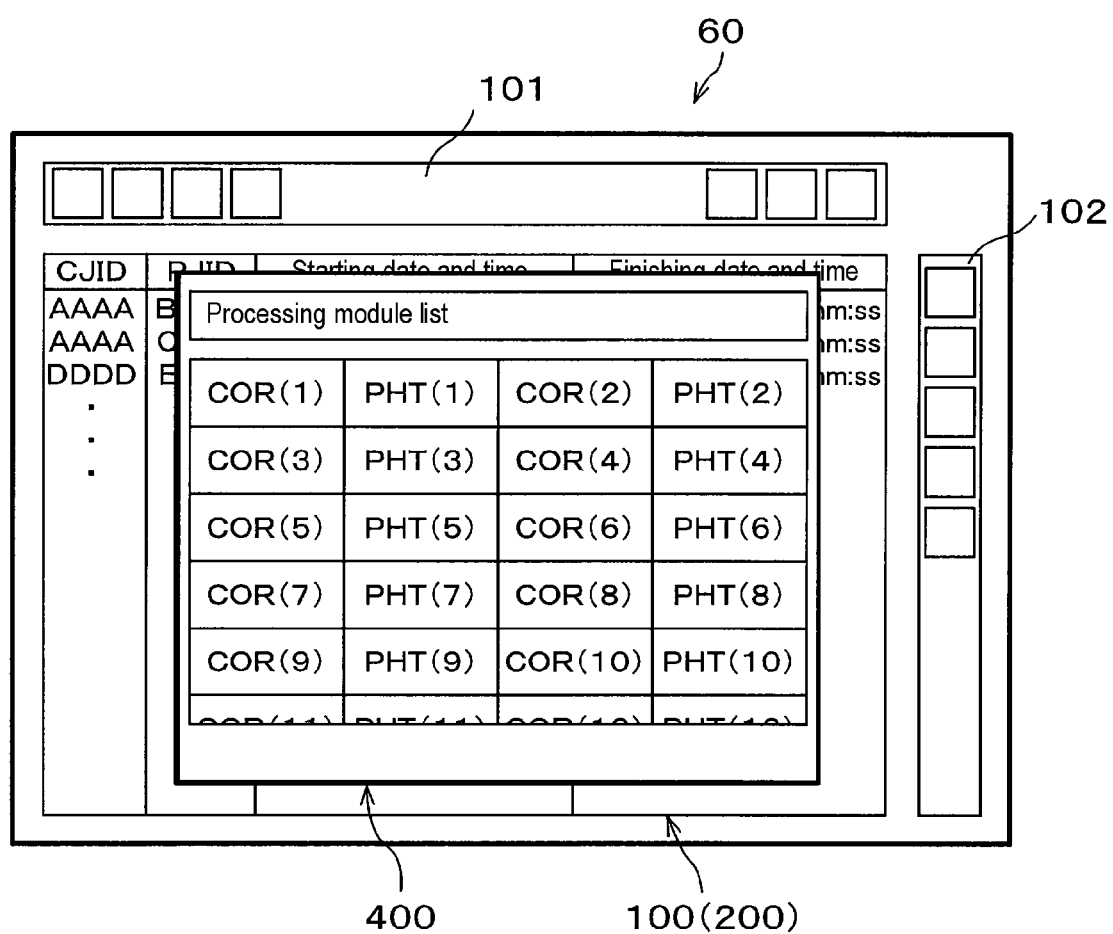
FIG. 4 is an exemplary screen for selecting a log in each module.

When the information selection area 102 is selected, a processing module list 400 in which wafer processing has been performed until the operation of the substrate processing apparatus 1 is stopped is displayed as illustrated in FIG. 4.

In the processing module list 400, for example, a list of processing modules, which have performed wafer processing until the operation of the substrate processing apparatus 1 is stopped, and cycle numbers (the numbers of repetitions of executed process cycles) in the processing modules are displayed. In the example of FIG. 4, the processing modules and the cycle numbers are displayed in the form of "module name (cycle number)". For example, "COR (3)" in the drawing indicates that the processing data of the third cycle in the COR module 41 is stored.

Figure 5:
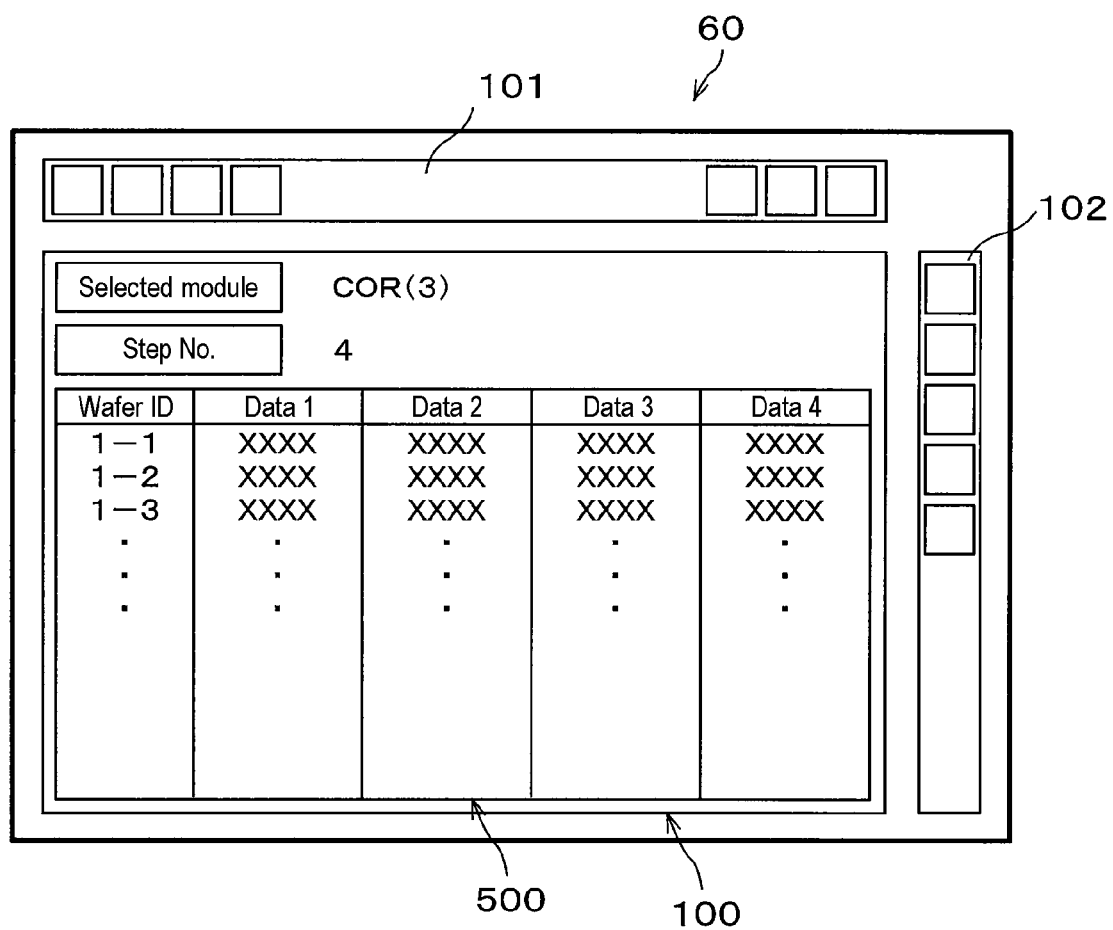
FIG. 5 is an exemplary screen for referring to a log in each module.

When an arbitrary "module name (cycle number)" in the processing module list 400 is selected, as illustrated in FIG. 5, the selected module name, the step number of a processing recipe for wafers W, and a process recipe list 500 are displayed in the information display area 100. Here, the step number of the processing recipe can be arbitrarily selected.

In the process recipe list 500, the identification numbers in the processing process of the wafers W processed in the corresponding processing module and step, and data of various processing performed on the wafers W are displayed. As an identification number of a wafer W, for example, "wafer 1-1" in FIG. 5 represents the first wafer W in the load port 32a. The processing data may include, for example, the pressure inside the chamber, the temperature inside the chamber, and the flow rate of the processing gas, in the corresponding processing module.

The display panel 60 displayed various kinds of information in the information display area 100, as described above. Then, an operator of the substrate processing apparatus 1 determined information related to wafer processing and information related to an error by referring to the various data, and performed a recovery process for the wafer in which the error occurred (hereinafter, referred to as "erroneous wafer $W_E$").

When executing the recovery process of an erroneous wafer $W_E$, it is necessary to determine at least the erroneous wafer $W_E$ in the load port 32, the processing module at the time of error occurrence, the error occurrence timing, and the cause of the error. Further, when the process cycle is repeated multiple times as described above, it is necessary to specify how many times the process cycle was performed until the error occurred.

However, as illustrated in FIGS. 2 to 5, it was necessary to refer to a plurality of screens in order to determine the information necessary for executing the recovery process of the erroneous wafer $W_E$. For example, it is possible to determine the error occurrence timing and the cause of the error in the error list 300. However, since it is impossible to specify the erroneous wafer $W_E$ and the cycle number in the error list 300, it is necessary to specify the erroneous wafer $W_E$ and the cycle number by repeatedly referring to the processing module list 400 and the process list 500. In addition, in the error list 300, it is not possible to classify and display an error according to the error occurrence timing and for each processing module in which the error occurred.

As described above, in the exemplary screen display displayed on the display panel 60, it is necessary to refer to a plurality of display screens in order to determine and classify necessary information. Therefore, it takes a lot of time and effort for an operator to execute a recovery process.

<Display Screen According to a Present Embodiment>

Therefore, in the present embodiment, the information necessary for the recovery process described above, that is, at least an erroneous wafer $W_E$, a processing module in which an error occurred, the error occurrence timing, and the cause of the error are collected and displayed in the same screen of the display panel 60. FIG. 6 is an explanatory view schematically illustrating an exemplary display screen according to the present embodiment displayed on the display panel 60.

When an error occurred in wafer processing and the operation of the substrate processing apparatus 1 is stopped, a process result list 600 for wafers W is displayed in the information display area 100 on the display panel 60, as illustrated in FIG. 6.

In the process result list 600, for example, at least identification numbers of all the processed wafers W in a processing process, cycle numbers, processing modules in which errors occurred, error occurrence timings, and causes of the errors are displayed.

The identification numbers of the processed wafers W in the processing process are the same as the identification numbers of the wafers W displayed in the process recipe list 500. That is, the identification numbers of the wafers W in the processing process are indicated. For example, "wafer 1-3" in FIG. 6 indicates that it is the third wafer W in the load port 32a. The identification numbers of the wafers W in the process result list 600 are displayed for all the wafers W, regardless of whether or not an error occurred in the wafers W.

In each cycle number, the number of repetitions of a process cycle set by a CJ and a PJ for each wafer W and the number of repetitions of the process cycle having executed until the error actually occurs are expressed as a denominator and a numerator. For example, the cycle "3/5" of the wafer 1-3 indicated in FIG. 6 indicates that an error occurred in the wafer 1-3 in the third process cycle among the process cycles set to be repeated five times.

The processing module in which an erroneous wafer $W_E$ was being processed at the time of error occurrence is specified and displayed as the processing module in which the error occurred. At this time, for example, when a plurality of same processing modules are provided as in the substrate processing apparatus 1 according to the present embodiment, it is possible to specify and display up to which processing module the error occurred in among the same processing modules.

For the error occurrence timing, for example, a timing at which an error occurred is displayed in the format of "h:mm:ss".

As the cause of the error, the direct cause of the error, which causes the processing to be stopped, such as non-attainment of the pressure or temperature of the processing module, and which occurred first, is displayed. In addition, a method for resolving the error may be displayed.

Regarding the processing module in which the error occurred, the error occurrence timing, and the cause of the error, "-" may be displayed when a corresponding wafer W is not an erroneous wafer $W_E$. That is, by checking these items, it is possible to instantly determine whether or not an error has occurred in the corresponding wafer W.

According to the present embodiment, in the information display area 100, the above-mentioned information is collected in the process result list 600, and is displayed together in the same screen. As a result, the information required for a recovery process can be referred to in one screen, rather than referring to a plurality of display screens, which greatly reduces the time and effort required for the recovery process and makes it easy to determine the information required for a recovery process.

The configuration of the process result list 600 illustrated in the embodiment described above is an example, and arbitrary information may be displayed in the information display area 100. Of course, the configuration of the substrate processing apparatus 1 is not limited to the example described above.

For example, in the above-described embodiment, the hour and minute at which the error occurred is displayed in the error occurrence timing of the process result list 600, but the display method is not limited thereto. For example, the step of the processing recipe in which the error occurred may be specified by a PJ, and the elapsed time from the start of the step may be displayed. This makes it possible to more easily determine the timing at which the error occurred in the processing recipe.

In the embodiment described above, the process result list 600 is displayed when a certain error occurred in wafer processing and the operation of the substrate processing apparatus 1 is stopped, but the screen display timing is not limited thereto. For example, the information may be displayed in the information display area 100 at the time point where a certain error occurs in the wafer W, or may be displayed at the time point at which the processing of a PJ including an erroneous wafer $W_E$ is finished.

The display panel 60 may be configured such that the process result list 600 can be linked to, for example, the error list 300 or the process recipe list 500 so that detailed information on each error and each wafer W can be easily identified. With such a configuration, since the process result list 600 is directly linked to the display screen of various detailed information, it becomes easier to determine various information.

In the embodiment described above, the process result list 600 is displayed in the information display area 100 when an error occurred in wafer processing and the operation of the substrate processing apparatus 1 is stopped. However, the process result list 600 may be displayed via a link, rather than being directly displayed. For example, when an error occurred in the wafer processing, the log list 200 may be displayed first, and the process result list 600 may be displayed in the information display area 100 by selecting an information selection area 101 or 102.

In the present embodiment, the process result list 600 is displayed in the information display area 100 when the operation of the substrate processing apparatus 1 is stopped due to an error. However, the process result list 600 may be referred to at any time, without being limited to the error occurrence timing.

In the process result list 600 of the embodiment described above, the processing module in which an error occurred is displayed. However, the transport modules (load-lock modules 20a and 20b, the loader module 30, transfer module 40) in which an error occurred may be displayed. As the cause of the error of the transport module, for example, the cause of a direct error, which causes the transport of the wafer W to be stopped, and which occurred first, is displayed. In addition, a method for resolving the error may be displayed.

It should be understood that the embodiments disclosed herein are illustrative and are not limiting in all aspects. The above-described embodiments may be omitted, replaced, or modified in various forms without departing from appended claims and contents thereof.

The following configurations also belong to the technical scope of the present disclosure. (1) A substrate processing apparatus for processing substrates, the substrate processing apparatus including a plurality of processing modules configured to perform predetermined processes on the substrates, and an information display configured to display information about an error that occurred in the predetermined processes. The information display is configured to display, in the same screen, a substrate on which a predetermined process in which the error occurred was being performed, a processing module which was performing the predetermined process in which the error occurred, a timing at which the error occurred, and a cause of the error.

In this way, by displaying, at least the substrate, the processing module which was performing processing in which the error occurred, the timing at which the error occurred, and the cause of the error in one screen on the information display screen, substrate-processing error information can be easily determined.

(2) The substrate processing apparatus of item (1), wherein the plurality of processing modules are further configured to repeatedly perform a process cycle including the predetermined processes, and the information display is further configured to display, in the same screen, a cycle number of the predetermined process in which the error occurred. By further displaying the cycle number at which the error occurred, the number of screens that should be referred to by an operator can be further reduced, and the substrate-processing error information can be more easily determined.

(3) The substrate processing apparatus of item (2), wherein the plurality of processing modules includes a COR module configured to perform a COR process on a substrate, and a heater configured to perform a heating process on the substrate, and in the process cycle, the COR process and the heating process are sequentially performed.

(4) A substrate processing method for processing substrates, the substrate processing method including performing predetermined processes on the substrates in a plurality of processing modules, and displaying information about an error that occurred in the predetermined processes, on an information display. The information display is configured to display items in the same screen, and the items include a substrate on which the error occurred, a processing module which was performing a predetermined process in which the error occurred, a timing at which the error occurred, and a cause of the error.

Item (4) has the same technical features as item (1). That is, the substrate-processing error information can be easily determined.

(5) The substrate processing method of item (4), wherein the performing the predetermined processes includes repeatedly performing a process cycle including the predetermined processes, and the displaying the information about the error includes displaying, by the information display, a cycle number of the predetermined process in which the error occurred in the same screen.

Item (5) has the same technical features as item (2). That is, the substrate-processing error information to be easily determined.

(6) The substrate processing method of item (5), wherein the performing the predetermined processes includes performing a COR process on a substrate, and performing a heating process on the substrate. In the process cycle, the COR process and the heating process are sequentially performed.

EXPLANATION OF REFERENCE NUMERALS

1: substrate processing apparatus, 33: CST module (processing module), 41: COR module (processing module), 42: PHT module (processing module), 60: display panel (information display), 100: information display area, W: wafer (substrate)

What is claimed is:

1. A substrate processing apparatus for processing substrates, the substrate processing apparatus comprising:
    a plurality of processing modules each configured to perform a predetermined process on the substrates as part of a process cycle, the process cycle comprising a sequence of different predetermined processes and being repeated a plurality number of times for each substrate; and
    an information display configured to display information about an error that occurred in at least one of the predetermined processes,
    wherein the information display is configured to display items in a same screen, the items comprising:
        a substrate on which a predetermined process in which the error occurred was being performed,
        a processing module which was performing the predetermined process in which the error occurred,
        a timing at which the error occurred,
        a cause of the error, and
        a cycle number identifying a number of times the process cycle was being repeated until the predetermined process in which the error occurred was performed on the substrate and a set number of times the process cycle was set to be repeated, and
        wherein the process cycle performed for an n-th time includes the predetermined process in which the error occurred, wherein n represents an integer corresponding to the number of times.

2. The substrate processing apparatus of claim 1, wherein the plurality of processing modules further comprises:
    a Chemical Oxide Removal (COR) module configured to perform a COR process on a substrate; and
    a heater configured to perform a heating process on the substrate, and wherein, in the process cycle, the COR process and the heating process are sequentially performed.

3. The substrate processing apparatus of claim 1, wherein the cause of the error is one that causes the predetermined process to be stopped and is one that occurred first.

4. The substrate processing apparatus of claim 1, wherein the information display is further configured to display, in the same screen, each of the other items corresponding to each of the substrates for which the error did not occur.

5. A substrate processing apparatus for processing substrates, the substrate processing apparatus comprising:
a plurality of processing modules each configured to perform a predetermined process on the substrates as part of a process cycle, the process cycle comprising a sequence of different predetermined processes and being repeated a plurality number of times for each substrate;
a plurality of transport modules configured to transport the substrates; and
an information display configured to display information about an error that occurred in at least one of the predetermined processes or while transporting the substrates,
wherein the information display is configured to display items in a same screen, the items comprising:
a substrate on which a predetermined process in which the error occurred was being performed,
a processing module which was performing the predetermined process in which the error occurred, or a transport module which was transporting the substrate on which the predetermined process in which the error occurred was being performed,
a timing at which the error occurred,
a cause of the error, and
a cycle number identifying a number of times the process cycle was being repeated until the predetermined process in which the error occurred was performed on the substrate and a set number of times the process cycle was set to be repeated, and
wherein the process cycle performed for an n-th time includes the predetermined process in which the error occurred, wherein n is an integer corresponding to the number of times.

6. The substrate processing apparatus of claim 5, wherein the information display is further configured to display, in the same screen, each of the other items corresponding to each of the substrates for which the error did not occur.

7. A substrate processing method for processing substrates, the substrate processing method comprising:
performing predetermined processes on the substrates as part of a process cycle, the process cycle comprising a sequence of different predetermined processes and being repeated a plurality number of times for each substrate; and
displaying information about an error that occurred in at least one of the predetermined processes on an information display,
wherein the information display configured to display items in a same screen, the items comprising:
a substrate on which a predetermined process in which the error occurred was being performed,
a processing module which was performing the predetermined process in which the error occurred,
a timing at which the error occurred,
a cause of the error, and
a cycle number identifying a number of times the process cycle was being repeated until the predetermined process in which the error occurred was performed on the substrate and a set number of times the process cycle was set to be repeated, and
wherein the process cycle performed for an n-th time includes the predetermined process in which the error occurred, wherein n represents an integer corresponding to the number of times.

8. The substrate processing method of claim 7, wherein the performing the predetermined processes further includes:
performing a COR process on a substrate; and
performing a heating process on the substrate, and
wherein, in the process cycle, the COR process and the heating process are sequentially performed.

9. The substrate processing method of claim 7, wherein the cause of the error is one that causes the predetermined process to be stopped and is one that occurred first.

10. The substrate processing method of claim 7, wherein the information display is further configured to display, in the same screen, each of the other items corresponding to each of the substrates for which the error did not occur.

* * * * *